United States Patent
Ohashi

(10) Patent No.: US 10,243,549 B2
(45) Date of Patent: Mar. 26, 2019

(54) DRIVE CIRCUIT FOR POWER ELEMENT

(71) Applicant: FUJI ELECTRIC CO., LTD., Kawasaki-shi, Kanagawa (JP)

(72) Inventor: Hidetomo Ohashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/146,106

(22) Filed: Sep. 28, 2018

(65) Prior Publication Data
US 2019/0036522 A1    Jan. 31, 2019

Related U.S. Application Data

(63) Continuation of application No. PCT/JP2017/036047, filed on Oct. 3, 2017.

(30) Foreign Application Priority Data

Oct. 14, 2016  (JP) .................. 2016-203152

(51) Int. Cl.
*H02M 1/08* (2006.01)
*H03K 17/14* (2006.01)
(Continued)

(52) U.S. Cl.
CPC ........ *H03K 17/08116* (2013.01); *H02M 1/08* (2013.01); *H03K 17/14* (2013.01); *H03K 17/567* (2013.01); *H02M 2001/0054* (2013.01)

(58) Field of Classification Search
CPC .. H03K 17/08; H03K 17/08166; H03K 17/14; H03K 17/567; H02M 1/08; H02M 2001/0054
See application file for complete search history.

(56) References Cited

U.S. PATENT DOCUMENTS 8,040,162 B2 * 10/2011 Miyazaki ................ H02M 1/08
                                                        327/108
8,723,564 B2 *  5/2014 Umetani .............. H03K 17/145
                                                        327/109
(Continued)

FOREIGN PATENT DOCUMENTS

JP    2001-24492 A    1/2001
JP    5011585 B2      6/2012

OTHER PUBLICATIONS

International Search Report dated Nov. 28, 2017 in corresponding International Patent Application No. PCT/JP2017/036047.
(Continued)

*Primary Examiner* — Patrick O Neill

(57) ABSTRACT

There is provided a drive circuit for turning on/off a power element which controls a main current flow between a first main electrode and a second main electrode in response to a drive signal applied to a control electrode. The drive circuit includes a a first semiconductor switching element and a second semiconductor switching element which are connected in series with a semiconductor element and provided between the power supply terminal and the ground terminal, third semiconductor switching element and a fourth semiconductor switching element which are connected in series, and a control circuit which controls turn-on/off of the power element by turning on/off the first to fourth semiconductor switching elements. The semiconductor element has a positive temperature characteristic.

8 Claims, 7 Drawing Sheets

(51) Int. Cl.
*H03K 17/567* (2006.01)
*H03K 17/081* (2006.01)
*H02M 1/00* (2006.01)

(56) References Cited

U.S. PATENT DOCUMENTS 9,019,000 B2 * 4/2015 Umetani ............. H03K 17/162
327/384
2010/0141304 A1 6/2010 Miyazaki

OTHER PUBLICATIONS

Written Opinion of the International Searching Authority dated Nov. 28, 2017 in corresponding International Patent Application No. PCT/JP2017/036047.

* cited by examiner

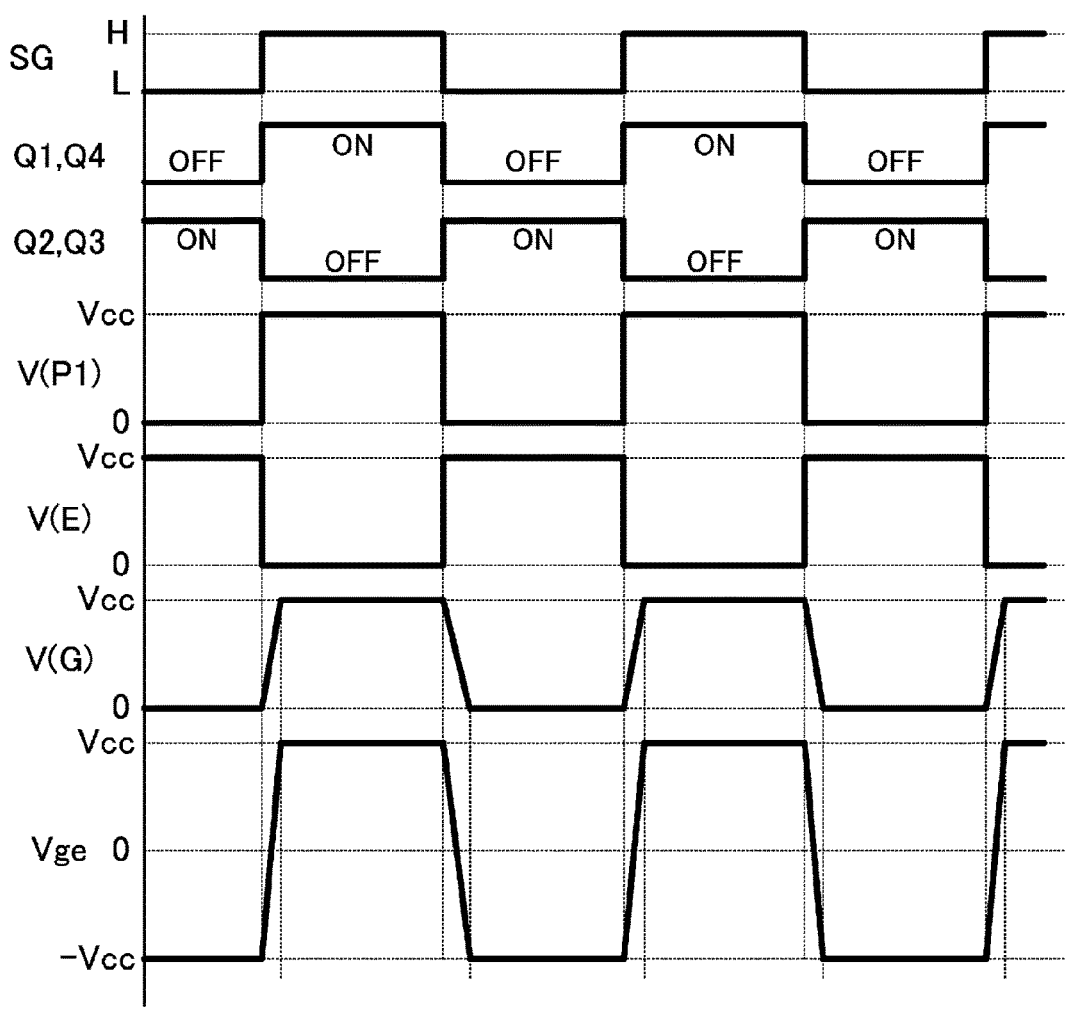

DRIVE CIRCUIT FOR POWER ELEMENT

CROSS-REFERENCE TO RELATED APPLICATIONS

This application is a Continuation of PCT Application No. PCT/JP2017/036047 filed Oct. 3, 2017, which claims the benefit of Japanese Patent Application No. 2016-203152 filed Oct. 14, 2016. The disclosures of the prior applications are hereby incorporated by reference herein in their entireties.

TECHNICAL FIELD

The present invention relates to a drive circuit which turns on/off a power element such as an IGBT and, in particular, relates to the drive circuit for the power element having a simple configuration in which power conversion efficiency of the power element can be improved without being affected by an operation voltage threshold value of the power element having a temperature dependency.

BACKGROUND ART

FIG. 6 is a schematic configuration diagram showing an example of a drive circuit 1 of a related art which turns or/off a power element 2 such as an IGBT. The drive circuit 1 plays a role of turning on/off a drive signal applied to the gate of the IGBT (power element) 2 and thus controlling a main current flow between the collector and the emitter of the IGBT 2. A current Ic supplied to a load (RL) connected between a main power supply 3 and the IGBT 2 is controlled in accordance with the on/off of the IGBT 2.

Schematically, the drive circuit 1 includes a first semiconductor switching element Q1 and a second semiconductor switching element Q2 which are connected in series and provided between a power supply terminal (Vcc) of a power supply 4 and a ground terminal (GND). Further, the drive circuit 1 includes a third semiconductor switching element Q3 and a fourth semiconductor switching element Q4 which are connected in series and provided between the power supply terminal (Vcc) of the power supply 4 and the ground terminal (GND). A series connection point (node P1) between the first and second semiconductor switching elements Q1, Q2 is connected to the gate of the IGBT 2 via a gate resistor RG. A series connection point (node P2) between the third and fourth semiconductor switching elements Q3, Q4 is connected to the emitter of the IGBT 2.

The first to fourth semiconductor switching elements Q1, Q2, Q3, Q4 are each formed of, for example, a MOS-FET and constitute a switch matrix circuit in which the first to fourth semiconductor switching elements are turned on/off in association with one another and thus turn the IGBT 2 on/off under the control of a control circuit 5. The control circuit 5 turns on/off the first to fourth semiconductor switching elements Q1, Q2, Q3, Q4 in association with one another in accordance with a control signal SG supplied from the outside, thereby controlling on/off of the IGBT 2.

FIG. 7 shows operation timings which represent state changes in respective portions of the drive circuit 1 according to the control signal SG and voltage changes in the IGBT 2. In FIG. 7, V(P1) represents the voltage change in the node P1, V(E) represents the voltage change in the emitter (node P2) of the IGBT 2, V(G) represents the voltage change in the gate of the IGBT 2, and Vge represents the voltage change between the gate and the emitter of the IGBT 2.

As shown in FIG. 7, the drive circuit 1 positively or negatively biases the gate emitter voltage Vge of the IGBT 2 according to the control signal SG, thereby turning the IGBT 2 on/off. That is, the drive circuit 1 turns on each of the first and fourth semiconductor switching elements Q1, Q4 and turns off each of the second and third semiconductor switching elements Q2, Q3, thereby setting the voltage of the node P1 to a power supply voltage Vcc and setting the voltage of the node P2 to a voltage (0 V) of the ground terminal (GND). Thus, the drive circuit 1 applies the voltage (power supply voltage Vcc) of the node P1 to the gate of the IGBT 2, the emitter of which is set to 0 V, via the gate resistor RG, thereby positively biasing the IGBT 2. Consequently, the IGBT 2 is turned on by the positive bias (+Vcc) applied between the gate and the emitter thereof.

The drive circuit 1 turns off each of the first and fourth semiconductor switching elements Q1, Q4 and turns on each of the second and third semiconductor switching elements Q2, Q3, thereby setting the voltage of the node P1 to 0 V and setting the voltage of the node P2 to the power supply voltage Vcc. Thus, the drive circuit 1 grounds the gate of the IGBT 2, the emitter of which is set to the power supply voltage Vcc, via the gate resistor RG, thereby negatively biasing the IGBT 2. Consequently, the IGBT 2 is turned off by the negative bias (−Vcc) applied between the gate and the emitter thereof. The drive circuit 1 configured in this manner is described in detail in, for example, Japanese Patent No. 5011585.

The drive circuit 1 disclosed in Japanese Patent No. 5011585 can turn the IGBT 2 on/off by positively or negatively biasing the IGBT 2 using only the positive power supply voltage Vcc which is outputted from the power supply 4. Thus, this drive circuit is superior in terms of not requiring a negative power supply. However, the drive circuit 1 of the related art is configured to apply the voltage V(P1) of the node P1 to the gate of the IGBT 2 via the gate resistor RG, thereby charging/discharging a gate capacitor of the IGBT 2. Accordingly, there arises the defect that a switching loss at the turn-on and off times of the IGBT 2 is large.

In this respect, Japanese Patent No. 5011585 discloses that the switching loss at the turn-on/off times of the IGBT 2 is reduced by shifting the on/off timings of the first to fourth semiconductor switching elements Q1, Q2, Q3, Q4 therebetween. However, in the case of shifting the on/off timings of the first to fourth semiconductor switching elements Q1, Q2, Q3, Q4 therebetween, there arises the new problem that the configuration of the control circuit 5 is complicated.

The IGBT 2 has a negative temperature characteristic in which an operation voltage threshold value Vth thereof decreases with temperature increase. Despite of this, the drive circuit 1 of the related art turns the IGBT 2 on by merely applying the voltage of the node P1 (power supply voltage Vcc) to the gate of the IGBT 2 via the gate resistor RG as a positive bias voltage. Thus, for example, when the operation voltage threshold value Vth of the IGBT 2 decreases with temperature increase, a voltage equal to or larger than a positive bias voltage necessary for maintaining the on state of the IGBT 2 is applied to the gate thereof.

Thus, it is necessary to use an IGBT having sufficient short-circuit withstand capability as the IGBT 2 in prospect of decrease of the operation voltage threshold value Vth of the IGBT 2. In general, an IGBT having sufficient short-circuit withstand capability is expensive, and therefore the entire configuration of a power converter using the IGBT 2 becomes inevitably large and expensive.

SUMMARY

The invention has been made in view of the above circumstances, and an object thereof is to provide a drive circuit for a power element which has a simple configuration, can suitably turn on/off the power element without using the gate resistor described above, and, in particular, can prevent application of an excessive voltage to a control electrode of the power element when positively biasing the power element and thus can reduce short-circuit withstand capability required for the power element.

A drive circuit for a power element according to an embodiment of the present invention is configured to turn on/off the power element, for example, an IGBT or an N-type power MOS-FET which is configured to control a main current flow between a first main electrode and a second main electrode in response to a drive signal applied to a control electrode.

The drive circuit for the power element according to the present invention includes a first series circuit which includes a first semiconductor switching element and a second semiconductor switching element connected in series with a semiconductor element or a constant voltage supply, having a positive temperature characteristic, therebetween. The first series circuit is provided between a power supply terminal and a ground terminal. In the first series circuit, a series connection point of the second semiconductor switching element provided on the ground terminal side and the semiconductor element or the constant voltage supply having the positive temperature characteristic is connected to the control electrode of the power element.

The drive circuit further includes a second series circuit which includes a third semiconductor switching element and a fourth semiconductor switching element connected in series. The second series circuit is provided between the power supply terminal and the ground terminal. In the second series circuit, a series connection point of the third semiconductor switching element and the fourth semiconductor switching element is connected to the second main electrode of the power element.

Further, the drive circuit includes, in addition to the first and second series circuits described above, a control circuit which is configured to control turn-on/off of the power element by turning on/off the first to fourth semiconductor switching elements in association with one another in response to a control signal.

The power element may include, for example, an IGBT which includes the control electrode as a gate, the first main electrode as a collector, and the second main electrode as an emitter. Each of the first to fourth semiconductor switching elements includes a MOS-FET which is configured to be turned on/off in response to a voltage applied to a gate thereof from the control circuit. Alternatively, the power element may include, for example, an N-type power MOS-FET which includes the control electrode as a gate, the first main electrode as a source, and the second main electrode as a drain. Each of the first to fourth semiconductor switching elements may include a MOS-FET which is configured to be turned on/off in response a voltage applied to a gate thereof from the control circuit.

The semiconductor element having the positive temperature characteristic may be formed of, for example, a Zener diode of which a reverse breakdown voltage increases with temperature increase. The constant voltage supply may include a constant-voltage diode circuit which is temperature compensated and outputs a constant voltage regardless of temperature change.

Preferably, in an normal operation for turning the power element on/off, the control circuit may be configured to turn the power element on by turning on each of the first and fourth semiconductor switching elements and turning off each of the second and third semiconductor switching elements, and turn the power element off by turning off each of the first and fourth semiconductor switching elements and turning on each of the second and third semiconductor switching elements.

At the time of short-circuit interruption in which the power element is forcibly turned off, the control circuit may be configured to turn on each of the first and third semiconductor switching elements and turn off each of the second and fourth semiconductor switching elements. Alternatively, at the time of the short-circuit interruption in which the power element is forcibly turned off, the control circuit may be configured to turn on each of the second and fourth semiconductor switching elements and turn off each of the first and third semiconductor switching elements.

According to an embodiment of the present invention, the power element can be positively biased with a constant voltage stably, regardless of a change in the operation voltage threshold value of the power element, by utilizing the positive temperature characteristic of the reverse breakdown voltage of the Zener diode provided in the first series circuit. Alternatively, according to an embodiment of the present invention, the power element can be positively biased stably, by applying a predetermined voltage capable of stably maintaining its on state to the gate of the power element, regardless of a change in the operation voltage threshold value of the power element under the constant voltage diode circuit which outputs a constant voltage.

Thus, regardless of a change in the operation voltage threshold value Vth of the power element (IGBT) depending on temperature, the power element can be surely turned on by being positively biased stably with the constant voltage, and thus the on state of the power element can be maintained stably. Further, it is also not necessary to apply an excessive electric field to the gate of the power element in prospect of, for example, a change in a power supply voltage. Furthermore, the power element can be positively biased with the constant voltage, and thus short-circuit withstand capability required for the power element can be reduced. Consequently, such an effect can be attained that the power element is not required to have excessive specifications and a cost of the power element thereof can be reduced.

According to an embodiment of the present invention, a switching loss of the power element (IGBT) at the turn-on/off times of the power element can be reduced without using the gate resistor in the drive circuit of the related art shown in FIG. 6 by way of example. Further, the drive circuit for the power element can be formed as a compact integrated circuit, and thus such a practically significant benefit is attained that the circuit configuration thereof can be simplified and the manufacturing cost thereof can be reduced.

BRIEF DESCRIPTION OF DRAWINGS

FIG. 7 is a timing chart showing turn-on/off states of a power element by the drive circuit for the power element of the related art.

DETAILED DESCRIPTION OF EMBODIMENTS

Hereinafter a drive circuit 10 for a power element according to an embodiment of the present invention will be explained with reference to drawings.

Figure 1:
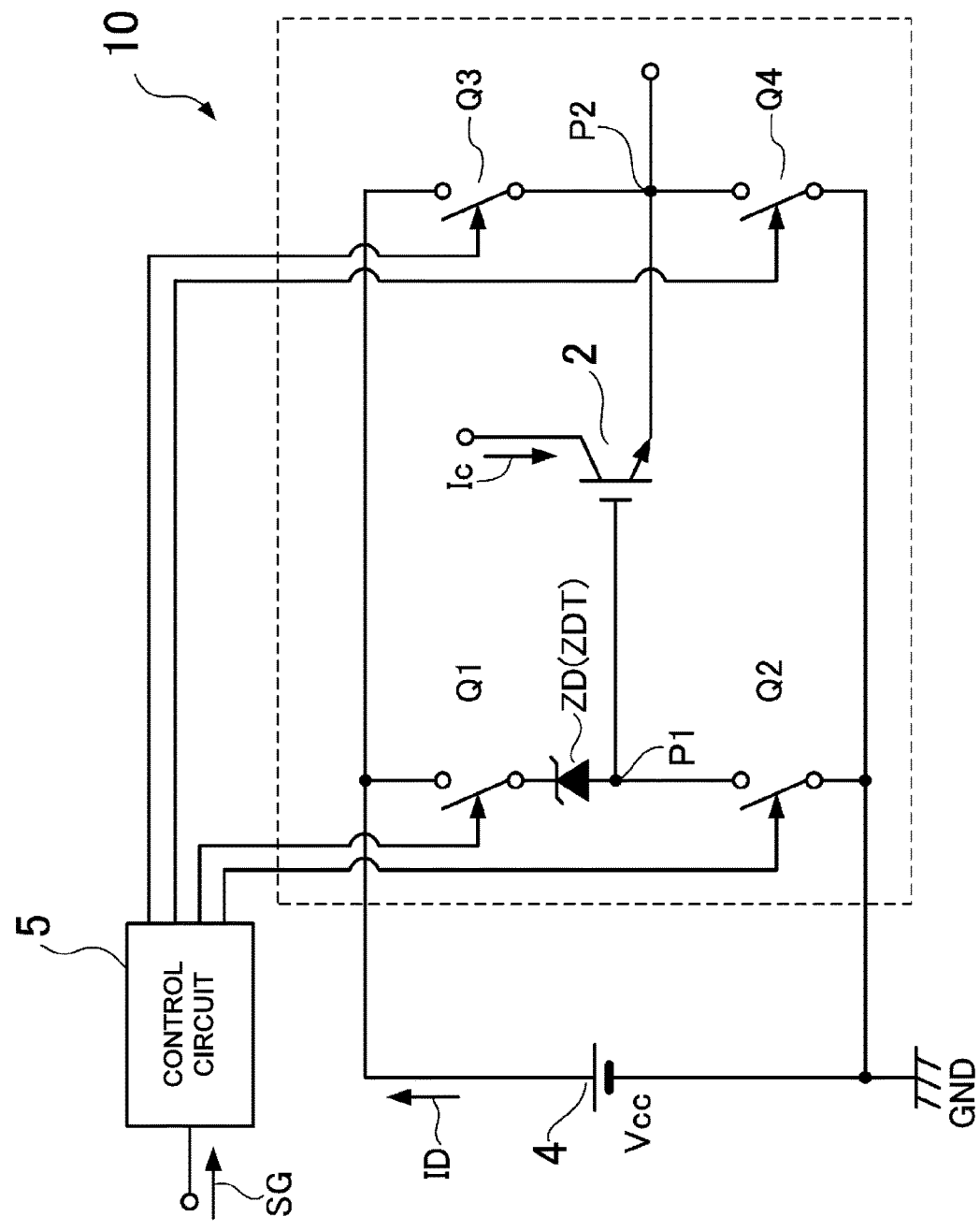
FIG. 1 is a schematic configuration diagram showing the general outline of a drive circuit for a power element according to an embodiment of the present invention.

FIG. 1 is a schematic configuration diagram showing the general outline of the drive circuit 10 for the power element according to the embodiment of the present invention. In the figure, portions identical to those of the drive circuit 1 of the related art shown in FIG. 6 are referred to by the common symbols.

The drive circuit 10 includes a first series circuit which is configured of a first semiconductor switching element Q1 and a second semiconductor switching element Q2 which are connected in series with a Zener diode ZD, which has, for example, a positive temperature characteristic, therebetween. The first series circuit is provided between a power supply terminal (Vcc) and a ground terminal (GND). A series connection point (node P1) between the anode of the diode ZD and the second semiconductor switching element Q2 provided on the ground terminal side is connected to the gate of an IGBT 2. Further, the drive circuit 10 includes a second series circuit which includes a third semiconductor switching element Q3 and a fourth semiconductor switching element Q4 connected in series. The second series circuit is provided between the power supply terminal (Vcc) and the ground terminal (GND). A series connection point (node P2) between the third semiconductor switching element Q3 and the fourth semiconductor switching element Q4 is connected to the emitter of the IGBT 2.

The first to fourth semiconductor switching elements Q1, Q2, Q3, Q4 are each formed of, for example, a MOS-FET. Specifically, the first to fourth semiconductor switching elements Q1, Q2, Q3, Q4 are respectively formed of switching MOS-FETs which have basically the same switching characteristic, the same current capacity, and the same withstand voltage. The first to fourth semiconductor switching elements Q1, Q2, Q3, Q4 constitute a switch matrix circuit wherein the first to fourth semiconductor switching elements are turned on/off in association with one another under the control of a control circuit 5, and thus turn the IGBT 2 on/off.

Figure 6:
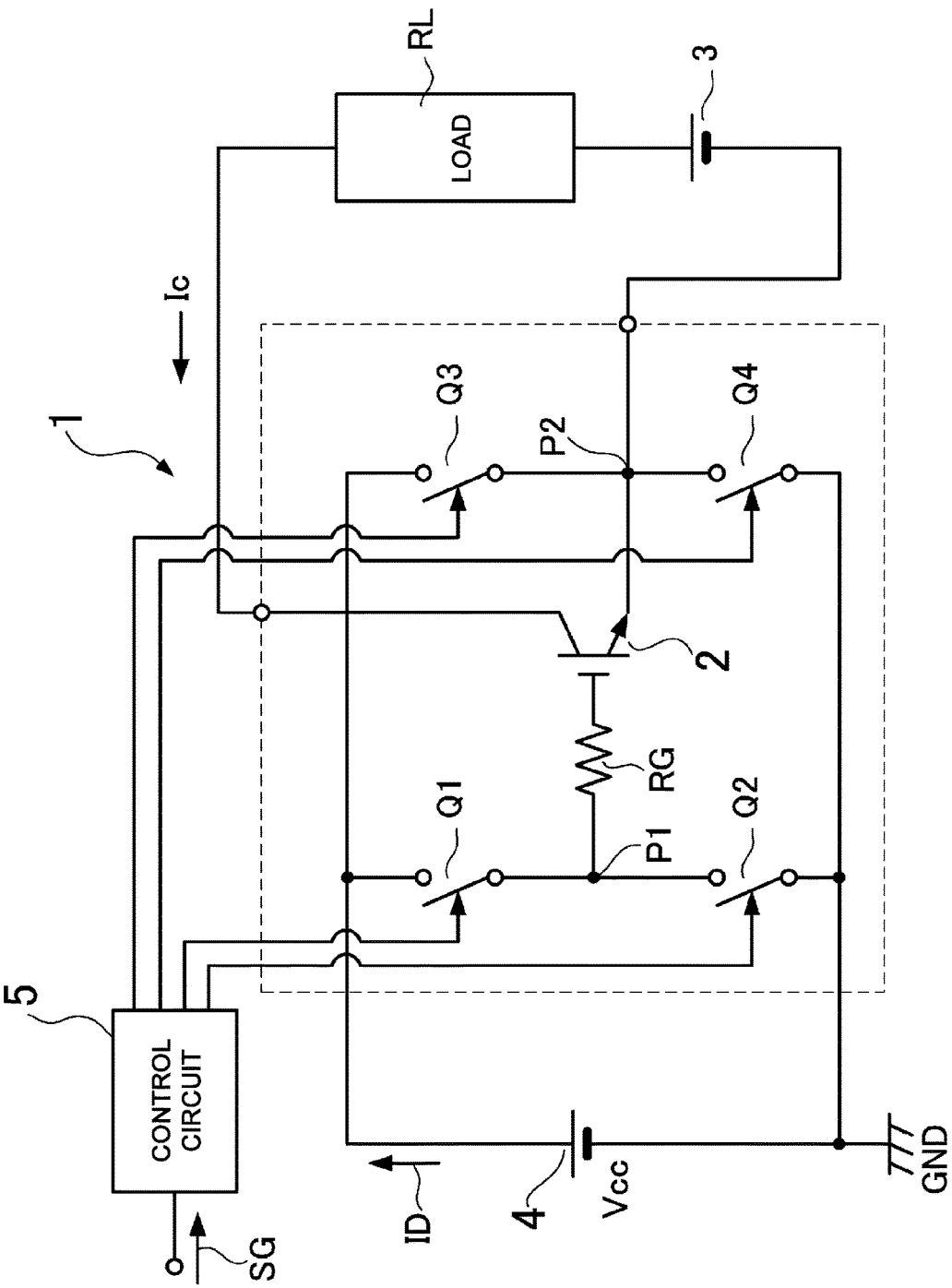
FIG. 6 is a schematic configuration diagram showing an example of a drive circuit for a power element of a related art.

In particular, the switch matrix circuit directly applies a voltage of the series connection point (node P1) between the anode of the Zener diode ZD and the second semiconductor switching element Q2 provided on the ground terminal side to the gate of the IGBT 2 without using the gate resistor RG in the drive circuit 1 of the related art shown in FIG. 6 by way of example. Further, the feature of the switch matrix circuit is that a voltage of the node P2, which serves as the series connection point between the third and fourth semiconductor switching elements Q3, Q4, is applied to the emitter of the IGBT 2.

Basically, in a normal operation for turning the IGBT 2 on/off, the drive circuit 10 turns the IGBT 2 on by turning on each of the first and fourth semiconductor switching elements Q1, Q4 and turning off each of the second and third semiconductor switching elements Q2, Q3. At the time of turning the IGBT 2 on, the emitter of the IGBT 2 is set to 0 V and the gate thereof is applied with the power supply voltage Vcc. As a consequence, the IGBT 2 is applied with the power supply voltage Vcc between the gate and the emitter thereof, and thus put in a positively biased state.

Further, the drive circuit 10 turns the IGBT 2 off by turning off each of the first and fourth semiconductor switching elements Q1, Q4 and turning on each of the second and third semiconductor switching elements Q2, Q3. At the time of turning the IGBT 2 off, the gate of the IGBT 2 is set to 0 V and the emitter thereof is applied with the power supply voltage Vcc. As a consequence, the IGBT 2 is basically applied with the negative power supply voltage (−Vcc) between the gate and the emitter thereof, and thus put in a negatively biased state.

The IGBT 2 has a negative temperature characteristic in which an operation voltage threshold value Vth thereof decreases with temperature increase. In contrast, the Zener diode ZD is a semiconductor element which has a positive temperature characteristic in which a reverse breakdown voltage Vr thereof increases with temperature increase. When the first semiconductor switching element Q1 is on, the first series circuit configured to include the Zener diode ZD generates, at the node P1, a voltage (Vcc-Vr) wherein the reverse breakdown voltage Vr of the Zener diode ZD is subtracted from the power supply voltage (Vcc). The voltage (Vcc-Vr) of the node P1 is applied to the gate of the IGBT 2. As a result, the positive voltage (Vcc-Vr) is applied between the gate and the emitter of the IGBT 2, and therefore the IGBT is put in a positively biased state.

Thus, when the operation voltage threshold value Vth of the IGBT 2 changes by a change in the temperature in a state where the first semiconductor switching element Q1 is on and the IGBT 2 is on, the voltage applied to the gate of the IGBT 2 from the node P1 also changes correspondingly. In other words, the voltage (Vcc-Vr) positively biasing the IGBT 2 also changes in accordance with the temperature change in the operation voltage threshold value Vth of the IGBT 2. Further, the voltage of the node P1 is directly applied to the gate of the IGBT 2.

As a result, in the state of positively biasing the IGBT 2, a voltage capable of maintaining the on state of the IGBT 2 is applied to the gate of the IGBT 2 in accordance with a change in the operation voltage threshold value Vth of the IGBT 2. Thus, an excessive voltage equal to or larger than a voltage necessary for maintaining the on state of the IGBT 2 is not applied to the gate thereof. As a result, it is not necessary to set a large voltage as the voltage applied to the gate of the IGBT 2 in prospect of a change in the operation voltage threshold value Vth of the IGBT 2. In other words, it is not necessary to set the short-circuit withstand capability required for the IGBT 2 to be larger than necessary, and thus the IGBT 2 less expensive and having necessary short-circuit withstand capability can be employed. Accordingly, the configuration of a power converter utilizing the on/off operation of the IGBT 2 can be simplified.

A constant voltage element ZDT which generates a constant voltage may be employed in place of the Zener diode ZD having the positive temperature characteristic described above. The constant voltage element ZDT is achieved, for example, as a temperature-compensated constant-voltage diode circuit which generates a constant reverse breakdown voltage regardless of temperature change. Specifically, although not shown particularly, the constant voltage element is achieved as a circuit which, using a Zener diode ZD having a positive temperature characteristic and a diode D having a negative temperature characteristic, compensates a change in the reverse breakdown voltage of the Zener diode ZD with a forward voltage of the diode D connected in series with the Zener diode, and thereby generating a constant voltage regardless of temperature change.

Also in the drive circuit 10 which uses the constant voltage element ZDT in place of the Zener diode ZD described above, the positive bias voltage applied to the gate of the IGBT 2 can be suppressed to a voltage necessary for the on operation of the IGBT. Thus, also in this case, it is not necessary to set the short-circuit withstand capability required for the IGBT 2 to be larger than necessary, and thus the IGBT 2 less expensive and having necessary short-circuit withstand capability can be employed. Further, the configuration of the power converter utilizing the on/off operation of the IGBT 2 can be simplified.

Figure 2:
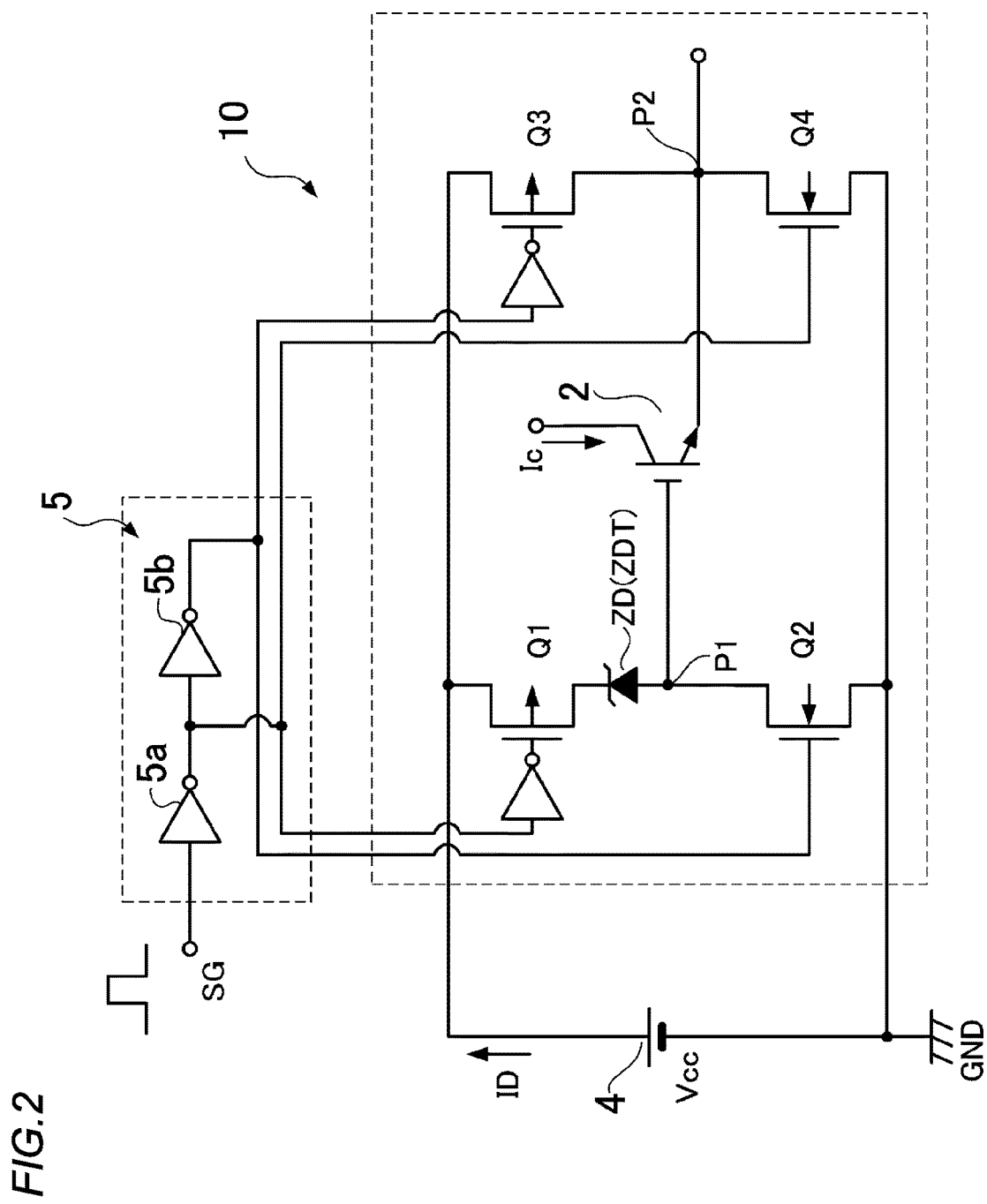
FIG. 2 is a diagram showing the concrete configuration example of the drive circuit shown in FIG. 1.

The control circuit 5 which turns on/off the first to fourth semiconductor switching elements Q1, Q2, Q3, Q4 in association with one another is configured as shown in, for example, FIG. 2. Specifically, the control circuit 5 includes a first inverter circuit 5a which inverts a control signal SG to generate a drive signal for turning on/off the first and fourth semiconductor switching elements Q1, Q4. The drive signal outputted from the first inverter circuit 5a takes a binary value, that is, the power supply voltage Vcc of a power supply 4 or the voltage (0 V) of the ground terminal so as to turn on/off the first and fourth semiconductor switching elements Q1, Q4.

The control circuit 5 further includes a second inverter circuit 5b which inverts the output of the first inverter circuit 5a to generate a drive signal for turning on/off the second and third semiconductor switching elements Q2, Q3. The drive signal outputted from the second inverter circuit 5b also takes a binary value of the power supply voltage Vcc of the power supply 4 or the voltage (0 V) of the ground terminal.

According to the control circuit 5 configured in this manner, the first and second semiconductor switching elements Q1, Q2 connected in series are turned on/off in an opposite manner by receiving the respective outputs from the first and second inverter circuits 5a, 5b. The third and fourth semiconductor switching elements Q3, Q4 connected in series are also turned on/off in an opposite manner by receiving the respective outputs from the second and first inverter circuits 5b, 5a. The control circuit 5 performs the on/off control of the IGBT 2 by performing the on/off control of the first to fourth semiconductor switching elements Q1, Q2, Q3, Q4 in association with one another, whereby the IGBT 2 is turned on and off.

When short-circuit is detected on a load side to which a current Ic is supplied via the IGBT 2, the IGBT 2 is forcibly turned off, whereby the IGBT 2 and the load (RL) are each protected from an excessive short-circuit current and further the drive circuits 10 are also protected.

The protection operation for the IGBT 2 by the short-circuit interruption is achieved, for example, by turning on each of the first and third semiconductor switching elements Q1, Q3 and turning off each of the second and fourth semiconductor switching elements Q2, Q4. Specifically, in the case of forcibly turning on each of the first and third semiconductor switching elements Q1, Q3 at the time of detecting the short-circuit, it is required to constitute the control circuit 5 as shown in, for example, FIG. 3 so as to switch respective on/off signals supplied to the first to fourth semiconductor switching elements Q1, Q2, Q3, Q4 in accordance with a short-circuit detection signal CO.

Figure 3:
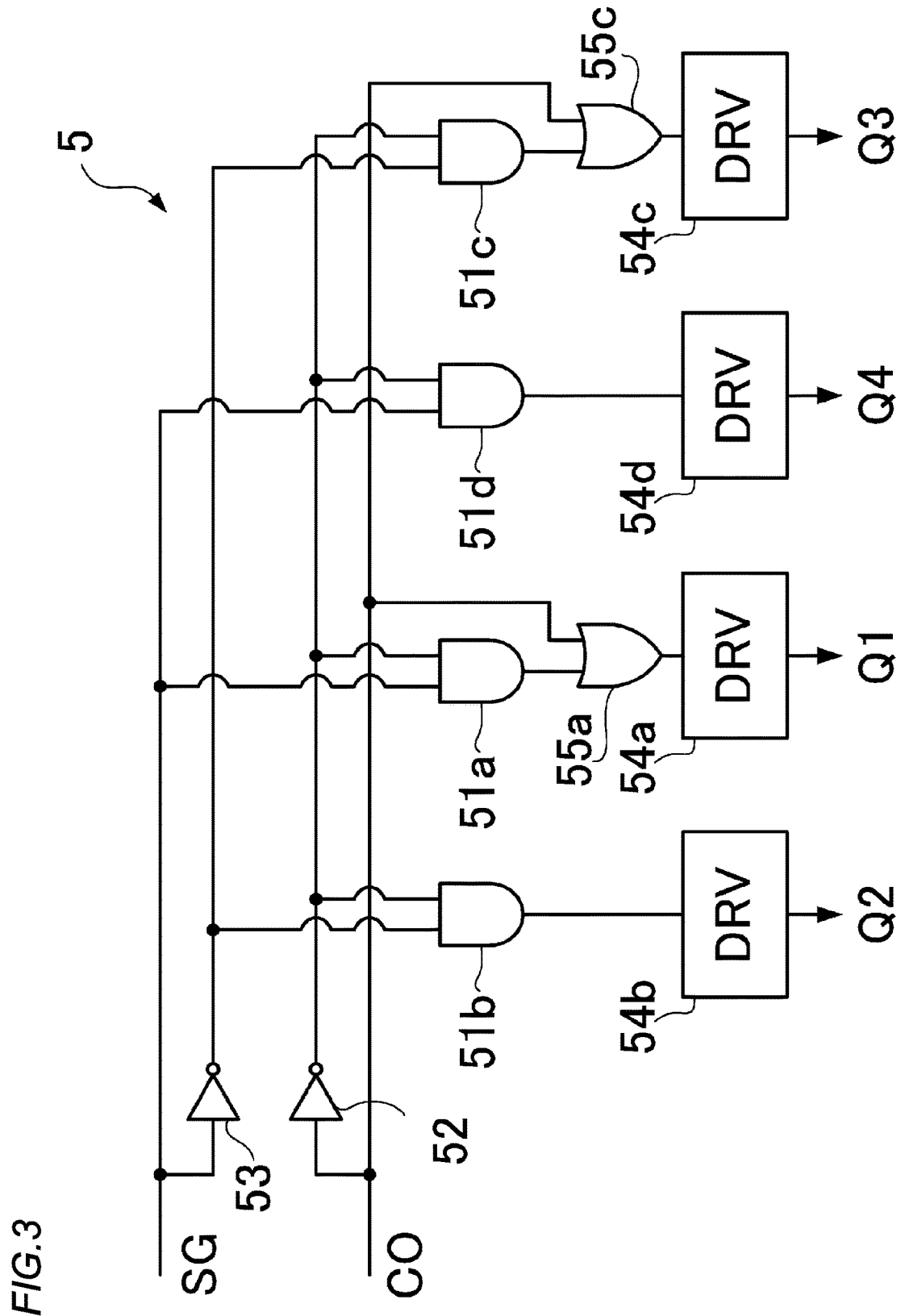
FIG. 3 is a diagram showing another configuration example of a control circuit in the drive circuit shown in FIG. 2.

The control circuit 5 shown in FIG. 3 includes four AND circuits 51a, 51b, 51c, 51d of which gates are each opened in accordance with the short-circuit detection signal CO. The AND circuits 51a, 51b, 51c, 51d are each opened via an inverter circuit 52 when the short-circuit detection signal CO is not supplied, in other words, when the short-circuit detection signal CO is at a low level (L) and so the IGBT 2 is to be normally operated. The AND circuits 51a, 51b, 51c, 51d supply the control signals SC or signals, which are obtained by inverting the control signals SG via an inverter circuit 53, to drive circuits 54a, 54b, 54c, 54d, respectively. The drive circuits 54a, 54b, 54c, 54d generate output voltages necessary for turning on/off the first to fourth semiconductor switching elements Q1, Q2, Q3, Q4, respectively.

In contrast, the AND circuits 51a, 51b, 51c, 51d are each closed when the short-circuit detection signal CO is supplied thereto, in other words, when the short-circuit detection signal CO becomes a high level (H). In this case, the short-circuit detection signal CO is supplied to the drive circuits 54a, 54c via respective OR circuits 55a, 55c. And, the short-circuit detection signal CO, which is inverted via the inverter circuit 52, is supplied to the drive circuits 54b, 54d via the respective AND circuits 51b, 51d.

Thus, when the short-circuit detection signal CO is supplied, the first and third semiconductor switching elements Q1, Q3 are each forcibly turned on, and concurrently, the second and fourth semiconductor switching elements Q2, Q4 are each forcibly turned off. As a result, the gate voltage V(G) of the IGBT 2 is set to the voltage (Vcc -Vr) and the emitter voltage V(E) of the IGBT 2 is set to the power supply voltage Vcc. Thus, the gate emitter voltage of the IGBT 2 is negatively biased by the reverse breakdown voltage Vr of the Zener diode ZD and thus the IGBT 2 is forcibly set to an off state. The current Ic flows into the load (RL) is interrupted in association with the forcible turning-off of the IGBT 2, and so the IGBT 2, etc. are protected from an overcurrent caused by the load short-circuit.

According to the drive circuit 10 configured in this manner, each of the first and third semiconductor switching elements Q1, Q3 is turned on, the voltage applied to the gate of the IGBT 2 is set to the voltage (Vcc-Vr), and the voltage applied to the emitter of the IGBT 2 is set to the power supply voltage Vcc. In this case, during a time period required for charging the gate capacitor of the IGBT 2, the gate emitter voltage Vge of the IGBT 2 is a negative voltage, and so the IGBT 2 is turned off. Accompanied with the turning-off of the IGBT 2, the gate capacitor of the IGBT 2 is discharged via the first semiconductor switching element Q1. Consequently, the gate emitter voltage Vge of the IGBT 2 is kept to the voltage (−Vf), and thus the IGBT 2 is kept to be negatively biased and maintains an off state.

Thus, even in the case of forcibly turning on each of the first and third semiconductor switching elements Q1, Q3 at the time of detecting the short-circuit, unlike the related art, the charging/discharging of the gate capacitor of the IGBT 2 is not performed via the gate resistor RG. Accordingly, a switching loss at the turn-off time of the IGBT 2 can be reduced. Consequently, a consumption power of the drive circuit 10 can be reduced.

Incidentally, in the short-circuit interruption, each of the second and fourth semiconductor switching elements Q2, Q4 can be forcibly turned on in place of the forcible turning-on of each of the first and third semiconductor switching elements Q1, Q3. In this case, it is indisputable that each of the first and third semiconductor switching elements Q1, Q3 is forcibly tuned off in conjunction with the forcible turning-on of each of the second and fourth semiconductor switching elements Q2, Q4.

In this manner, when the first and third semiconductor switching elements Q1, Q3 are each tuned off, and simultaneously, the second and fourth semiconductor switching elements Q2, Q4 are each tuned on, the gate voltage V(G) of the IGBT 2 is set to the ground voltage (0 V) and, the emitter voltage V(E) of the IGBT 2 is also set to the ground voltage (0 V). As a result, the gate emitter voltage Vge of the IGBT 2 becomes 0 V, and thus the IGBT 2 is forcibly turned off. The current Ic flows into the load (RL) is interrupted in association with the forcible turning-off of the IGBT 2, whereby the IGBT 2, etc. are protected from an overcurrent caused by the load short-circuit.

Figure 4:
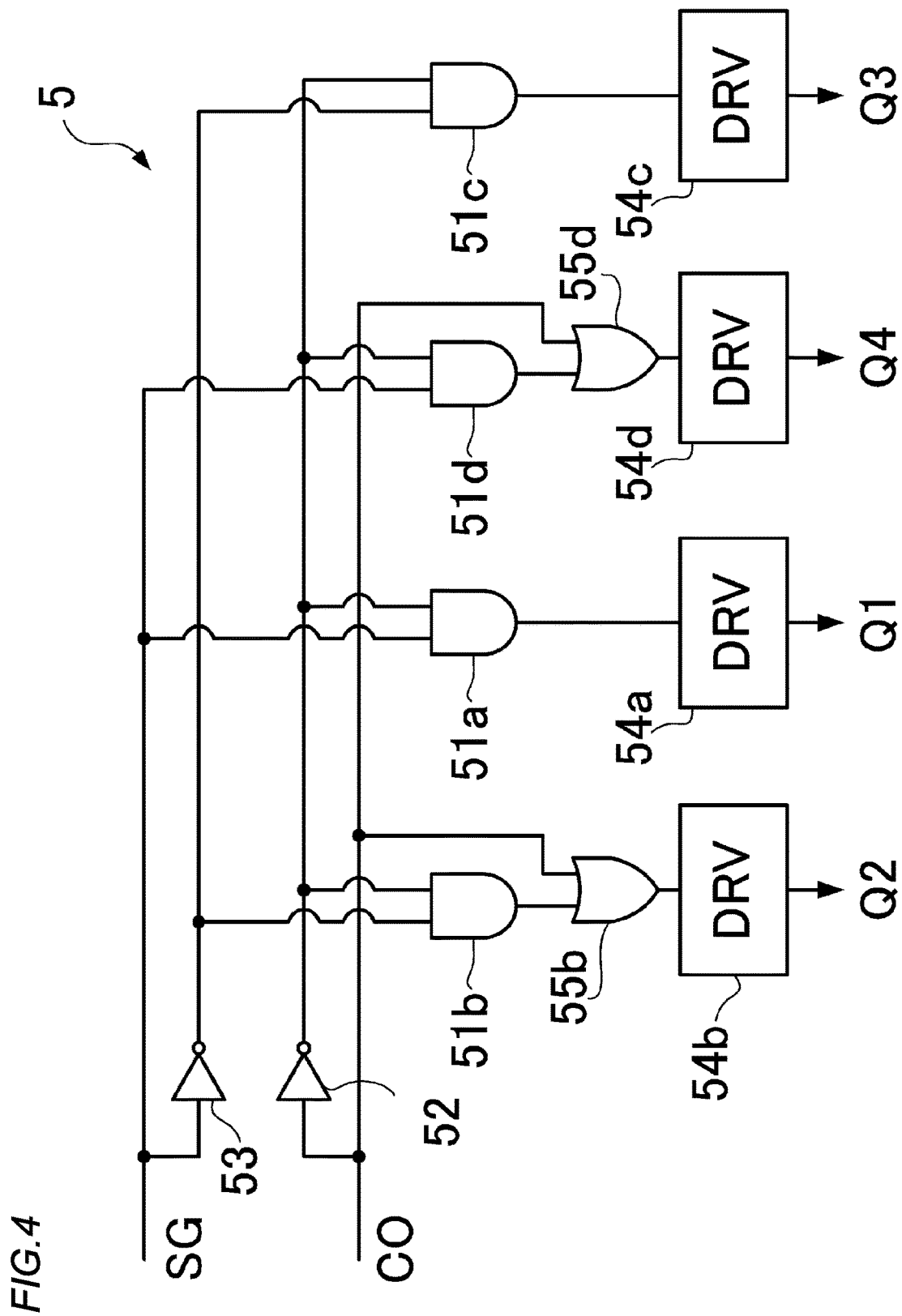
FIG. 4 is a diagram showing still another configuration example of the control circuit in the drive circuit shown in FIG. 2.

Incidentally, in the case of forcibly turning on each of the first and third semiconductor switching elements Q1, Q3 as described above when the short-circuit detection signal CO is supplied, it is only required to constitute the control circuit 5 as shown in, for example, FIG. 4. The control circuit 5 shown in FIG. 4 is configured that the short-circuit detection signal CO is supplied to the drive circuits 54b, 54d via respective OR circuits 55b, 55d, and that the short-circuit detection signal CO, which is inverted by the inverter circuit 52, is supplied to the drive circuits 54a, 54c via the respective AND circuits 51a, 51c.

According to the drive circuit 10 configured in this manner, only the second and fourth semiconductor switching elements Q2, Q4 having the small on-resistances Ron are turned on, and thus a switching loss at the turn-off time of the IGBT 2 can be further reduced. The charging/discharging of the gate capacitor of the IGBT 2 is not performed via the gate resistor RG, a power consumption of the drive circuit 10 can be reduced correspondingly.

Further, the gate resistor RG used in the drive circuit 1 of the related art is eliminated, and so the first semiconductor switching element Q1 can be downsized. Thus, when forming the drive circuit 10 as an integrated circuit, a chip area thereof can be reduced. Further, the gate resistor RG is not required to be formed side by side with the MOS-FET, etc. on a semiconductor chip, and thus such an effect can be attained that a manufacturing cost of the drive circuit can be suppressed low.

Figure 5:
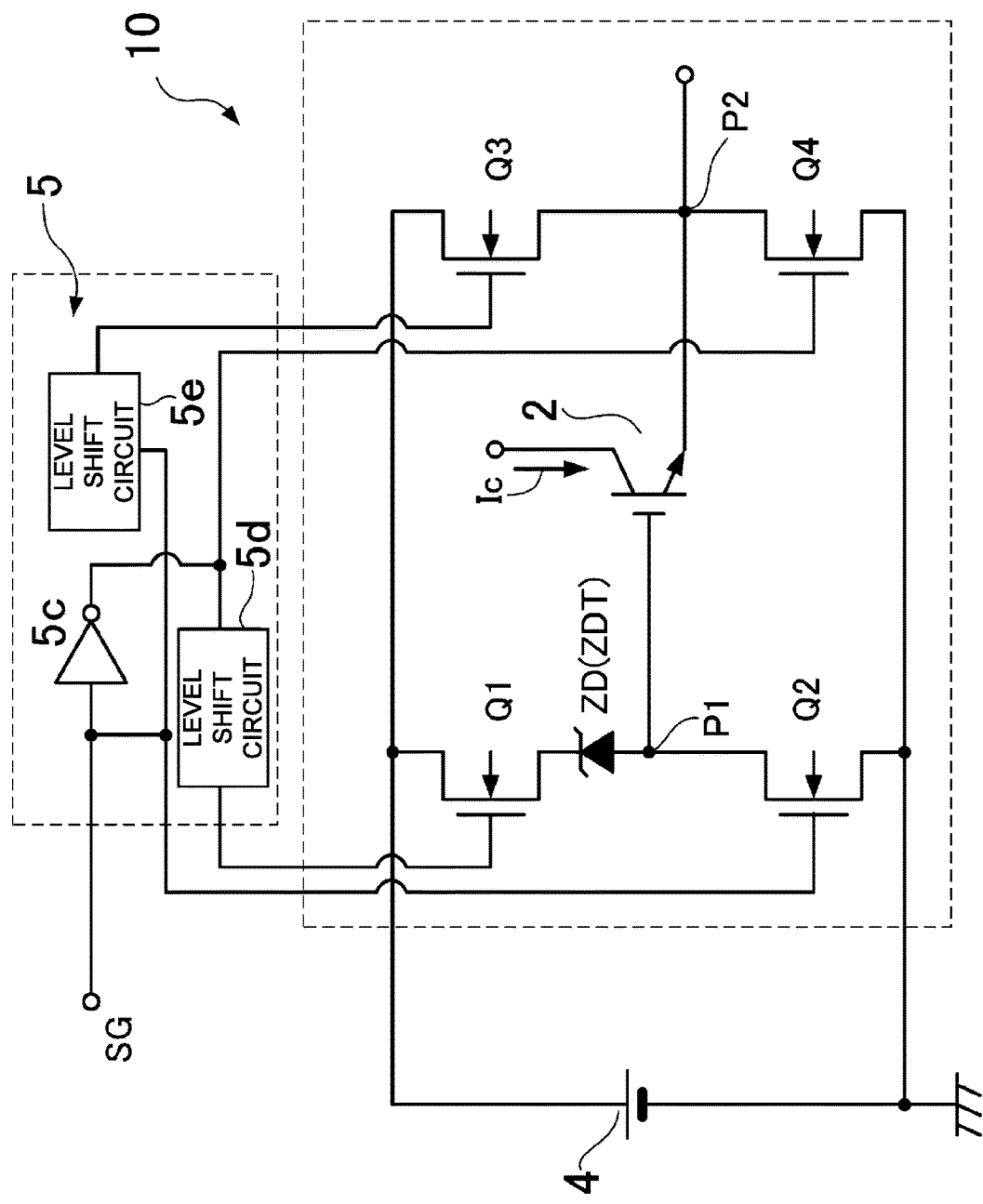
FIG. 5 is a diagram showing another concrete configuration example of the drive circuit shown in FIG. 1.

In the above-described explanation, the example is shown in which a P-type MOS-FET is used as each of the first and third semiconductor switching elements Q1, Q3 and an N-type MOS-FET is used as each of the second and fourth semiconductor switching elements Q2, Q4. As shown in FIG. 5 by way of example, however, the switch matrix circuit can be configured using an N-type MOS-FET as each of the first to fourth semiconductor switching elements Q1, Q2, Q3, Q4. In this case, it is also indisputable that the MOS-FET having a larger on-resistance Ron than the second to fourth semiconductor switching elements Q2, Q3, Q4 is used as the first semiconductor switching element Q1.

In this case, a tuning-on operating condition of the first and third semiconductor switching elements Q1, Q3 formed of the N-type MOS-FETs differs from the tuning-on operating condition of the first and third semiconductor switching elements Q1, Q3 formed of the P-type MOS-FETs in the drive circuit 10 shown in FIG. 2. That is, the first and third semiconductor switching elements Q1, Q3 turn on/off in accordance with the voltages of the respective nodes P1, P2, as reference voltages, which change in accordance with the turning-on/off of the first to fourth semiconductor switching elements Q1, Q2, Q3, Q4.

Thus, in this case, as shown in FIG. 5, the control circuit 5 is required to be configured that the input and output of an inverter circuit 5c, which inverts the control signal SG, are supplied to the gates of the third and first semiconductor switching elements Q3, Q1 via level shift circuits 5e, 5d, respectively. Also in the drive circuit 10 in which the switch matrix circuit is configured using the N-type MOS-FET as each of the first to fourth semiconductor switching elements Q1, Q2, Q3, Q4 in this manner, the voltage of the node P1 as the series connection point between the first and second semiconductor switching elements Q1, Q2 is directly applied to the gate of the IGBT 2. Thus, effects similar to that of the above-described embodiment can be attained.

Incidentally, the invention is not limited to the above-described embodiment. For example, although not illustrated in particular, it is of course possible to use a P-type MOS-FET as each of the first to fourth semiconductor switching elements Q1, Q2, Q3, Q4. Alternatively, it is of course possible to use an N-type MOS-FET as each of the first and second semiconductor switching elements Q1, Q2 and a P-type MOS-FET as each of the third and fourth semiconductor switching elements Q3, Q4.

Further, as described above, the present invention can also be applied to the case of driving a power MOS-FET as the power element. Moreover, it is indisputable that a bipolar transistor may be used as each of the first to fourth semiconductor switching elements Q1, Q2, Q3, Q4. The configuration of the control circuit 5 can be changed in various manners according to the configuration of the switch matrix circuit and the turn-on/off states, etc. of the first to fourth semiconductor switching elements Q1, Q2, Q3, Q4 constituting the switch matrix circuit. The present invention can be implemented in such a way as to be changed in various manners in a range not departing from the gist of the invention.

The invention claimed is:

1. A drive circuit for turning on/off a power element which is configured to control a main current flow between a first main electrode and a second main electrode in response to a drive signal applied to a control electrode, the drive circuit comprising:
    a first series circuit which includes a first semiconductor switching element and a second semiconductor switching element connected in series with a semiconductor element or a constant voltage element therebetween, which is provided between a power supply terminal and a ground terminal, wherein the semiconductor element or the constant voltage element has a positive temperature characteristic, and wherein a series connection point of the second semiconductor switching element provided on the ground terminal side and the semiconductor element or the constant voltage element having the positive temperature characteristic is connected to the control electrode of the power element;
    a second series circuit which includes a third semiconductor switching element and a fourth semiconductor switching element connected in series, which is provided between the power supply terminal and the ground terminal, wherein a series connection point of the third semiconductor switching element and the fourth semiconductor switching element is connected to the second main electrode of the power element; and
    a control circuit which is configured to control turn-on/off of the power element by turning on/off the first to fourth semiconductor switching elements in association with one another in response to a control signal.

2. The drive circuit according to claim 1,
wherein the semiconductor element having the positive temperature characteristic includes a Zener diode of which a reverse breakdown voltage increases with temperature increase, and
wherein the first series circuit is configured to change a voltage applied to the control electrode of the power element in accordance with a change in an operation voltage threshold value of the power element when the first semiconductor switching element is turned on.

3. The drive circuit according to claim 1,
wherein the constant voltage element includes a temperature-compensated constant-voltage diode circuit which is configured to generate a constant reverse breakdown voltage regardless of temperature change, and
wherein the first series circuit is configured to apply, when the first semiconductor switching element is turned on, a voltage necessary for turning the power element on regardless of a change in an operation voltage threshold value of the power element.

4. The drive circuit according to claim 1,
wherein in a normal operation for turning the power element on/off, the control circuit is configured to:
turn the power element on by turning on each of the first and fourth semiconductor switching elements and turning off each of the second and third semiconductor switching elements, and
turn the power element off by turning off each of the first and fourth semiconductor switching elements and turning on each of the second and third semiconductor switching elements.

5. The drive circuit according to claim 1,
wherein at a time of forcibly turning the power element off, the control circuit is configured to turn on each of the first and third semiconductor switching elements and turn off each of the second and fourth semiconductor switching elements.

6. The drive circuit according to claim 1,
wherein at a time of forcibly turtling the power element off, the control circuit is configured to turn on each of the second and fourth semiconductor switching elements and turn off each of the first and third semiconductor switching elements.

7. The drive circuit according to claim 1,
wherein the power element includes an IGBT which includes the control electrode as a gate, the first main electrode as a collector, and the second main electrode as an emitter, and
wherein each of the first to fourth semiconductor switching elements includes a MOS-FET which is configured to be turned on/off in response to a voltage applied to a gate thereof from the control circuit.

8. The drive circuit according to claim 1,
wherein the power element includes an N-type power MOS-FET which includes the control electrode as a gate, the first main electrode as a drain, and the second main electrode as a source, and
wherein each of the first to fourth semiconductor switching elements includes a MOS-FET which is configured to be turned on/off in response to a voltage applied to a gate thereof from the control circuit.

* * * * *

UNITED STATES PATENT AND TRADEMARK OFFICE
CERTIFICATE OF CORRECTION

PATENT NO. : 10,243,549 B2
APPLICATION NO. : 16/146106
DATED : March 26, 2019
INVENTOR(S) : Hidetomo Ohashi It is certified that error appears in the above-identified patent and that said Letters Patent is hereby corrected as shown below:

In the Claims

Column 12, Line 8:
In Claim 6, delete "turtling" and insert -- turning --, therefor.

Signed and Sealed this
Ninth Day of July, 2019

Andrei Iancu
*Director of the United States Patent and Trademark Office*